(12) United States Patent
Lo

(10) Patent No.: US 6,459,583 B1
(45) Date of Patent: Oct. 1, 2002

(54) READY-TO-MOUNT HEAT DISSIPATING ASSEMBLY

(75) Inventor: Wei-Ta Lo, Miou-Li (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/686,127

(22) Filed: Oct. 10, 2000

(30) Foreign Application Priority Data

Jul. 5, 2000 (TW) .................................... 89211584 U

(51) Int. Cl.⁷ ................................................ H05K 7/20
(52) U.S. Cl. ...................... 361/704; 361/690; 174/16.3; 165/80.3; 257/718; 257/719; 257/727; 411/516; 24/458
(58) Field of Search ................................ 361/702–704, 361/707, 709, 690, 694, 695, 697, 717–719; 165/80.3, 185; 257/706, 707, 713, 717–719, 722, 727; 174/16.3; 411/516, 522, 523; 248/316.7, 510; 24/457, 520

(56) References Cited

U.S. PATENT DOCUMENTS

| | | | | |
|---|---|---|---|---|
| 5,570,271 A | * | 10/1996 | Lavochkin | 361/704 |
| 5,621,244 A | * | 4/1997 | Lin | 257/713 |
| 5,889,653 A | * | 3/1999 | Clemens et al. | 361/704 |
| 6,105,215 A | * | 8/2000 | Lee | 24/458 |
| 6,205,026 B1 | * | 3/2001 | Wong et al. | 361/704 |
| 6,246,584 B1 | * | 6/2001 | Lee et al. | 361/704 |
| 6,311,765 B1 | * | 11/2001 | Lo et al. | 165/80.3 |

\* cited by examiner

*Primary Examiner*—Boris Chervinsky
(74) *Attorney, Agent, or Firm*—Wei Te Chung

(57) ABSTRACT

A heat dissipating assembly includes a heat sink (12) and a pair of clips (14). The heat sink has a base (20) defining a pair of slots (24) spaced from each other, and a plurality of fins (22) extending from a top surface of the base between the slots. The clip defines a pressing body (40) and two legs (50) extending from opposite ends of the pressing body, each leg defining an aperture (52). A horizontal portion (48) formed at the middle of the pressing body forms a U-shaped hook (42) extending downward from one side edge thereof. The hook is elastically deformable to be engagingly and interferentially received in the slot of the base of the heat sink for attaching the clip to the heat sink. The assembly is a singe unit ready to be conveniently mounted onto an electronic device.

7 Claims, 3 Drawing Sheets

READY-TO-MOUNT HEAT DISSIPATING ASSEMBLY

BACKGROUND

1. Field of the Invention

The present invention relates to a heat dissipating assembly, and particularly to a heat dissipating assembly which includes a heat sink and a clip attached to the heat sink.

2. The Related Art

An electronic device, such as a Central Processing Unit (CPU), generates a large amount of heat during operation, which deteriorates the operational stability thereof. Consequently, heat sinks are attached to the electronic devices to remove heat from the devices. Due to the different coefficients of thermal expansion, the heat sinks are not typically glued or otherwise permanently attached to the device. Instead, the heat sinks are typically releasably attached to the electronic devices by clips.

A conventional clip comprises a pressing body and two arms extending from opposite ends of the pressing body. Each arm defines an aperture for engaging with a tab formed on a socket on which an electronic device is mounted, thereby pressing a heat sink to the electronic device. However, the clip cannot be attached to the heat sink before engaging with the socket, which makes the assembling of the clip and the heat sink complicated and cumbersome. Furthermore, the clip and heat sink must be packed and transported separately from the electronic device, resulting in high costs. Examples of conventional clips are disclosed in Taiwan Patent Applications Nos. 85211135, and 85214941 and U.S. Pat. Nos. 5,602,719 and 5,600,540.

SUMMARY OF THE INVENTION

Accordingly, an object of the present invention is to provide a heat dissipating assembly including a heat sink and a clip attached to the heat sink which facilitates assembling thereof.

Another object of the present invention is to provide a heat dissipation assembly which reduces packaging and transportation costs.

To achieve the above-mentioned objects, a heat dissipating assembly comprises a heat sink and a pair of clips. The heat sink has a base defining a pair of parallel slots spaced from each other, and a plurality of fins extending perpendicularly from a top surface of the base between the slots. The clip includes a pressing body and two legs extending from opposite ends of the pressing body, each leg defining an aperture. A horizontal portion formed at the middle of the pressing body forms a U-shaped hook depending perpendicularly from one side edge thereof. The hook is elastically deformable to be engagingly and interferentially received in the slot of the base of the heat sink, thereby attaching the clip to the heat sink.

Other objects, advantages and novel features of the present invention will be drawn from the following detailed description of a preferred embodiment of the present invention with the attached drawings, in which:

DESCRIPTION OF THE PREFERRED EMBODIMENT

Figure 1:
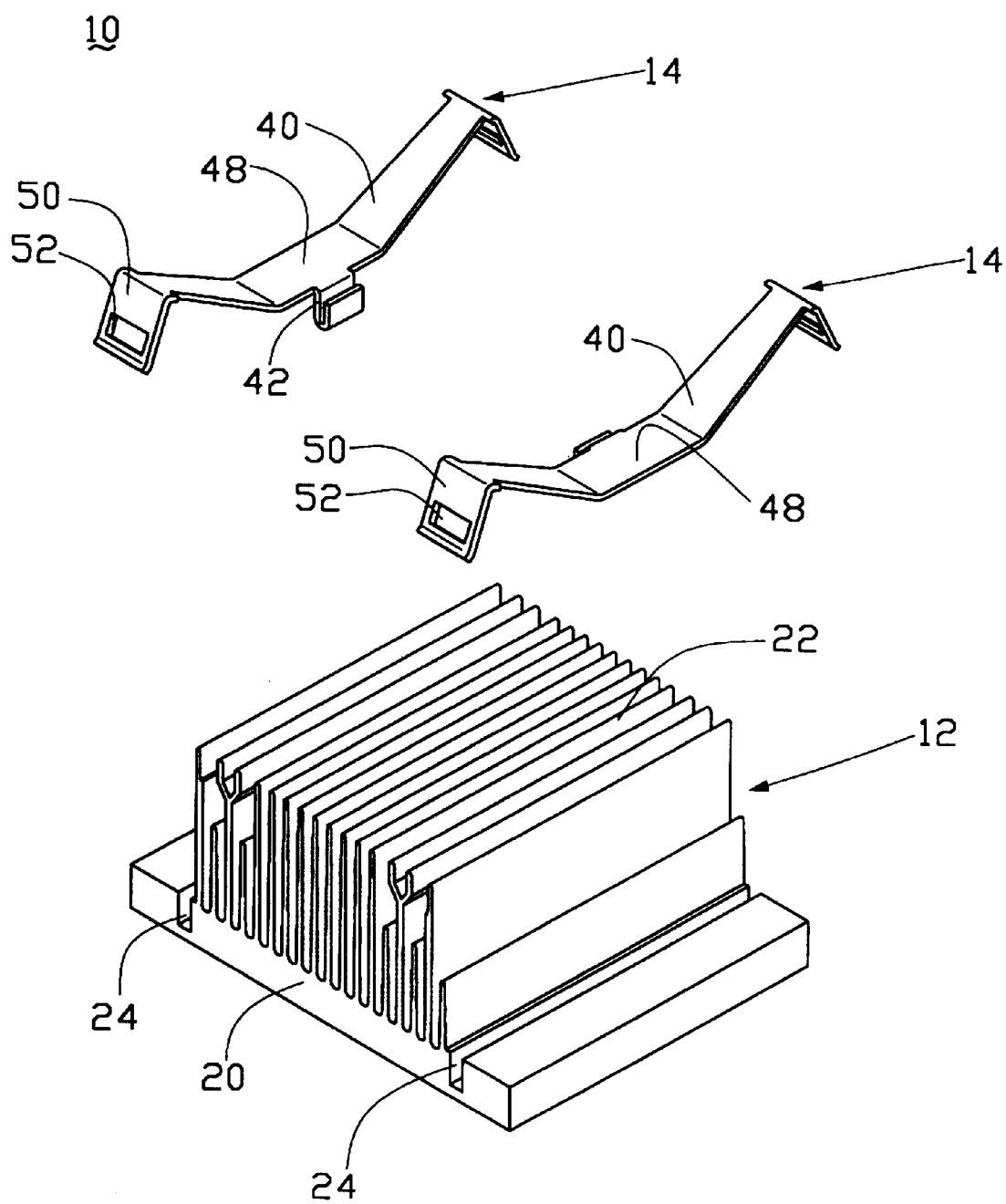
FIG. 1 is an exploded view of a heat dissipating assembly in accordance with the present invention.
Figure 2:
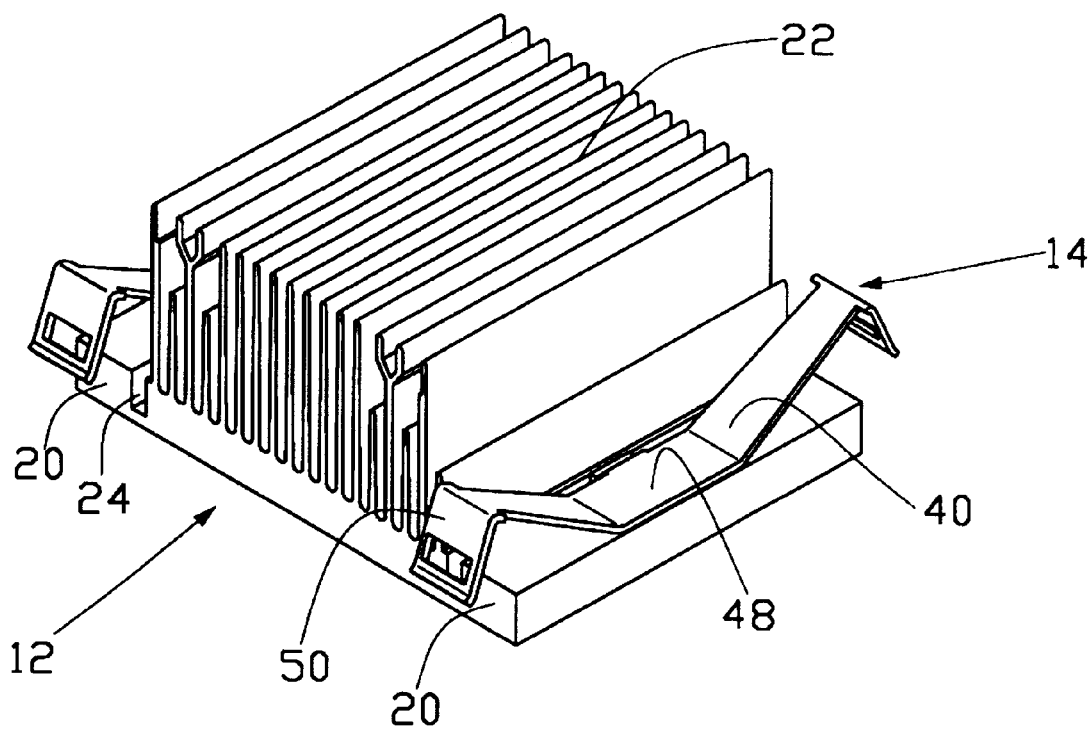
FIG. 2 is an assembled view of FIG. 1.

Referring to FIGS. 1 and 2, a heat dissipating assembly 10 includes a heat sink 12 and a pair of clips 14. The heat sink 12 has a base 20 defining a pair of slots 24 spaced from each other, and a plurality of fins 22 extending from a top surface of the base 20 between the slots 24.

Each clip 14 defines a pressing body 40 and two legs 50 extending from opposite ends of the pressing body 40. Each leg 50 defines an aperture 52 for receiving a pair of corresponding tabs 72 formed on a retention module 70 (referring to FIG. 3). A horizontal portion 48 formed at the middle of the pressing body 40 forms a U-shaped hook 42 extending downward from one side edge thereof. The hook 42 can be elastically deformed to be engagingly and interferentially received in the slot 24 of the base 20 of the heat sink 12, thereby attaching the clip 14 to the heat sink 12. Thus, the clip 14 and the heat sink 12 are assembled together before being mounted on an electronic device.

Figure 3:
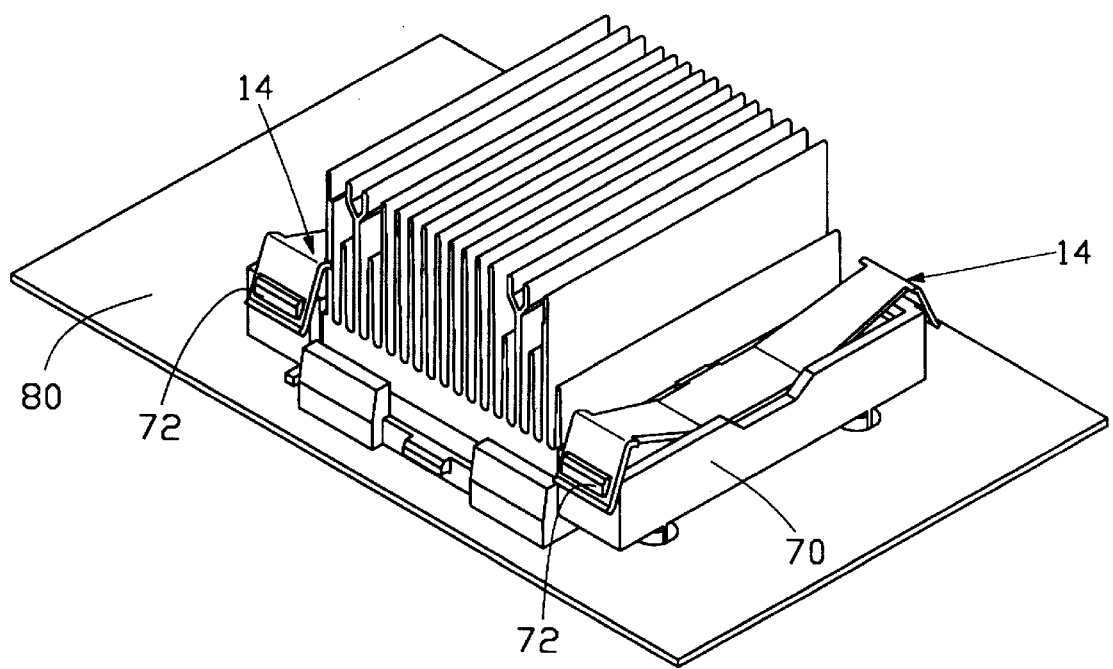
FIG. 3 is an assembled view showing the heat dissipating assembly of the present invention attached to an electronic device.

Also referring to FIG. 3, in assembly, the heat dissipating assembly 10 is attached to an electronic device (not shown) mounted on a printed circuit board 80. The apertures 52 of the clips 14 are engaged with the tabs 72 of a pair of corresponding retention modules 70 mounted at opposite sides of the electronic device. Thus the heat dissipating assembly 10 is securely attached to the electronic device.

The heat dissipating assembly 10 of the present invention includes at least the following two advantages:

1. Since the hook 42 of the clip 14 is received in the slot 24 of the base 20 of the heat sink 12 to attach the clip 14 to the heat sink 12, the entire heat dissipating assembly 10 is able to be conveniently mounted as a simple single unit onto an electronic device, by snapping the clips 14.

2. Because the clip 14 and the heat sink 12 can be assembled together in advance, packing and transportation are simplified, thereby reducing the costs thereof.

It is understood that the invention may be embodied in other forms without departing from the spirit thereof Thus, the present example and embodiment are to be considered in all respects illustrative and not restrictive, and the invention is not to be limited to the details given herein.

What is claimed is:

1. A heat dissipating assembly comprising.

a heat sink comprising a base defining at least one slot therein; and at least one clip having a pressing body pressing the base of the heat sink, and two legs respectively depending from two opposite ends of the pressing body, the pressing body forming a U-shaped hook which extends from a side edge of the pressing body and is elastically horizontally deformed to be engagingly and interferentially received in the slot of the base of the heat sink for fixing the clip to the heat sink.

2. The heat dissipating assembly as described in claim 1, wherein the base of the heat sink defines a pair of slots spaced from each other and a plurality of fins extending from a top surface of the base between the slots.

3. The heat dissipating assembly as described in claim 1, wherein each of the legs of the clip defines an aperture.

4. The heat dissipating assembly as described in claim 1, wherein the hook is formed at one side edge of a horizontal portion of the pressing body of the clip.

5. The heat dissipating assembly as described in claim 4, wherein the hook is U-shaped.

6. A heat sink assembly comprising:

a retention module device defining two pairs of tabs at two opposite side portions, respectively;

a heat sink restrictively positioned in the retention module, said heat sink defining a groove along each of said side portions; and a clip including a pressing body and two legs at two opposite ends thereof; wherein the pressing body abuts against the heat sink, a U-shaped hook extends from a side edge of the body and is elastically horizontally deformed to be retainably received within the groove whereby the clip is engageably attached to the heat sin and the two legs are latchably engaged with the corresponding tabs, respectively.

7. A method of assembling a heat sink assembly, comprising the steps of:

providing a pair of retention modules each with a pair of tabs at two ends thereof;

mounting the pair of retention module on a printed circuit board;

providing a heat sink with a pair of grooves in two opposite side portions thereof, respectively;

positioning the heat sink between said pair of retention modules; and providing a pair of clips each with an elongate pressing body with a U-shaped hook extending from a side edge thereof and a pair of legs at two opposite ends thereof; wherein before the pair of legs are latched with the corresponding tabs for having the depressing body abutting against the heat sink, the U-shaped hook of each of said clips has been elastically horizontally deformed and thus already retainably received within the corresponding groove for attaching the clip to the heat sink.

* * * * *